(12) United States Patent
Choi

(10) Patent No.: US 8,023,304 B2
(45) Date of Patent: Sep. 20, 2011

(54) MEMORY MODULE, METHOD AND MEMORY SYSTEM HAVING THE MEMORY MODULE

(75) Inventor: Jung-hwan Choi, Suwon-si (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 130 days.

(21) Appl. No.: 11/019,674

(22) Filed: Dec. 23, 2004

(65) Prior Publication Data
US 2005/0170673 A1    Aug. 4, 2005

Related U.S. Application Data

(63) Continuation of application No. PCT/KR02/01197, filed on Jun. 24, 2002.

(51) Int. Cl.
*G11C 5/06* (2006.01)
(52) U.S. Cl. ............ 365/64; 361/789; 365/63; 398/140; 711/104
(58) Field of Classification Search .............. 361/789; 365/63–64, 230.05; 398/140; 711/104
See application file for complete search history.

(56) References Cited

U.S. PATENT DOCUMENTS

| | | | | |
|---|---|---|---|---|
| 3,812,297 A | * | 5/1974 | Borbas | 714/10 |
| 4,232,199 A | * | 11/1980 | Boatwright et al. | 379/197 |
| 5,391,917 A | * | 2/1995 | Gilmour et al. | 257/690 |
| 5,420,593 A | * | 5/1995 | Niles | 342/357.12 |
| 5,424,573 A | * | 6/1995 | Kato et al. | 257/431 |
| 5,430,859 A | | 7/1995 | Norman et al. | |
| 5,500,810 A | * | 3/1996 | Shou et al. | 708/300 |
| 5,539,846 A | * | 7/1996 | Morikura et al. | 385/24 |
| 5,545,584 A | * | 8/1996 | Wuu et al. | 438/152 |
| 5,566,318 A | * | 10/1996 | Joseph | 711/118 |
| 5,721,545 A | * | 2/1998 | Poplevine | 341/100 |
| 5,758,100 A | | 5/1998 | Odisho | |
| 5,809,328 A | | 9/1998 | Nogales et al. | |
| 6,019,502 A | * | 2/2000 | Baeg et al. | 714/718 |

(Continued)

FOREIGN PATENT DOCUMENTS

JP    10-126018    5/1998

(Continued)

OTHER PUBLICATIONS

Intel Corporation. PC SDRAM Unbuffered DIMM Specification. Revision 1.0. Feb. 1998.*

(Continued)

*Primary Examiner* — Matthew D Spittle
(74) *Attorney, Agent, or Firm* — Harness, Dickey & Pierce, P.L.C.

(57) ABSTRACT

The memory module includes a plurality of memory devices, a first connector and a second connector. The first connector is disposed at a first position on the memory module. The first connector is configured to carry low-speed signals for the memory devices. The second connector is disposed at a second position on the memory module, different from the first position. The second connector is configured to carry high-speed signals for at least one of the memory devices. The high-speed signals are a higher speed form of signaling than the low-speed signals. The memory system may include at least one slot electrically connected to a chip set and at least one memory module electrically connected to the slot via the first connector. A transmission line such as a fiber optic cable electrically connects the second connector and the chip set.

14 Claims, 7 Drawing Sheets

U.S. PATENT DOCUMENTS

| | | | | |
|---|---|---|---|---|
| 6,067,325 | A * | 5/2000 | Carter, IV | 375/283 |
| 6,108,228 | A * | 8/2000 | Kao et al. | 365/52 |
| 6,125,419 | A | 9/2000 | Umemura et al. | |
| 6,314,050 | B1 * | 11/2001 | Yi et al. | 365/233.14 |
| 6,333,915 | B1 * | 12/2001 | Fujita | 370/223 |
| 6,347,039 | B1 * | 2/2002 | Lee | 361/760 |
| 6,453,377 | B1 * | 9/2002 | Farnworth et al. | 710/300 |
| 6,493,493 | B1 * | 12/2002 | Crafts | 385/115 |
| 6,766,410 | B1 * | 7/2004 | Carlton | 711/105 |
| 6,793,408 | B2 * | 9/2004 | Levy et al. | 385/88 |
| 6,950,350 | B1 * | 9/2005 | Kerl | 365/193 |
| 7,313,332 | B2 * | 12/2007 | Pappalardo et al. | 398/183 |
| 7,366,423 | B2 * | 4/2008 | Levy et al. | 398/164 |
| 2002/0022405 | A1 | 2/2002 | Jung et al. | |
| 2002/0065971 | A1 | 5/2002 | Farnworth et al. | |
| 2003/0043426 | A1 * | 3/2003 | Baker et al. | 359/109 |
| 2008/0077731 | A1 * | 3/2008 | Forrest et al. | 711/104 |

FOREIGN PATENT DOCUMENTS

| | | |
|---|---|---|
| JP | 11-039251 | 2/1999 |
| JP | 2001-257018 | 9/2001 |
| KR | 2000-0018572 | 4/2000 |

OTHER PUBLICATIONS

Katayama et al. Optical Interconnect Opportunities for Future Server Memory Systems. IEEE. 2007.*
Hadke et al. OCDIMM: Scaling the DRAM Memory Wall Using WDM based Optical Interconnects. IEEE. 2008.*
Han et al. An Optical Centralized Shared-Bus Architecture Demonstrator for Microprocessor-to-Memory Interconnects. IEEE. 2003.*
English Translation of Office Action for Corresponding German Patent Application No. 102 97 754.2-53.
International Search Report (PCT/ISA/210 & PCT/ISA/220).
International Preliminary Examination Report (PCT/IPEA/416 & PCT/IPEA/409).
Office Action for corresponding German Application No. 102 97 754.2-53 dated Apr. 27, 2006 and English translation thereof.
Office Action for Japanese patent application No. 2004-515188 dated Jul. 27, 2010 (with partial English translation).
Satoshi Isa, et al., "1Gbit DDR-SDRAM," NEC, vol. 52, No. 3, Mar. 25, 1999, pp. 7-10 (with English abstract).
"IEEE 1394, Part 1" DOS/V Magazine, vol. 9, No. 4, Mar. 1, 2000, pp. 144-147 (with English abstract).

* cited by examiner

MEMORY MODULE, METHOD AND MEMORY SYSTEM HAVING THE MEMORY MODULE

This application is a continuation of, and claims priority under 35 U.S.C. §120 and/or 35 U.S.C. §365(c) from, PCT International Application No. PCT/KR2002/001197 which has an International filing date of Jun. 24, 2002, the entire contents of which are hereby incorporated herein by reference.

BACKGROUND OF THE INVENTION

1. Field of the Invention

The present invention relates to a memory module and a memory system having the memory module.

2. Description of the Related Art

FIG. 1 is a view of a prior art memory module. Referring to FIG. 1, a memory module 10 includes a plurality of semiconductor memory devices 11_i (where i is 1 through 9) and a first connector 13 having a plurality of connection terminals connected via a bus (not shown) with the memory devices 11_i.

FIG. 2 is a view of a prior art memory system including memory module of FIG. 1. Referring to FIG. 2, a memory system 20 includes a motherboard 21, a chip set (or a controller) 23 mounted on a printed circuit board (PCB) of the motherboard 21, and two memory modules 10_1 and 10_2. The memory modules 10_1 and 10_2 are inserted into slots 25_1 and 25_2, respectively.

Data and command signals output from the chip set 23 are input to the plurality of semiconductor memory devices 11 via a bus on the PCB of the motherboard 21, the respective slot 25, the respective connector 13 and the bus of the respective memory module 10.

Data output from the plurality of semiconductor memory devices 11 of each of the memory modules 10_1 and 10_2 is output to the chip set 23 via the bus of each of the memory modules 10_1 and 10_2, the respective first connector 13, the respective slot 25 and the bus on the motherboard 21.

In a case where command signals, power supplies, and high-speed data are transmitted via the buses of the motherboard 21, the attenuation of data transmitted via the buses and crosstalk among the buses increase with an increase in the operational speed of the memory system 20. Due to this, the number of memory modules, which may be used in the memory system 20, is reduced.

Also, the difference (1) in the distance between the chip set 23 and the slot 25_1 and (2) the distance between the chip set 23 and the slot 25_2 causes skews of signals input/output between the chip set 23 and the memory module 10_1 and between the chip set 23 and the memory module 10_2.

SUMMARY OF THE INVENTION

The present invention provides a memory module providing separate paths for carrying high-speed and low speed signals. Similarly, the memory system according to the present invention provides separate paths for carrying high-speed and low-speed signals to and/or from the memory module.

In one embodiment, the memory module includes a plurality of memory devices, a first connector and a second connector. The first connector is disposed at a first position of the memory module. The first connector is configured to carry low-speed signals for the memory devices. The second connector is disposed at a second position on the memory module, different from the first position. The second connector is configured to carry high-speed signals for at least one of the memory devices. The high-speed signals are a higher speed form of signaling than the low-speed signals.

For example, the low-speed signals include at least one of a power supply voltage, a ground voltage, and a clock signal. As another example, the low-speed signals may include low-speed data such as a chip select signal, a read enable signal, and/or a write enable signal.

The high speed signals may include high-speed data.

In one embodiment, the memory module includes a converter receiving serial high-speed data from the second connector, converting the serial high-speed data to parallel data, and sending the parallel data to at least one of the memory devices.

In another embodiment, the memory module includes a converter receiving parallel data from at least one of the memory devices, converting the parallel data to serial high-speed data, and sending the serial high-speed data to the second connector.

The method according to an embodiment of the present invention includes carrying low-speed signals for the memory devices using a first connector at a first position of the memory module; where the first connector is configured to carry low-speed signals for the memory devices. The method further includes carrying high-speed signals for at least one of the memory devices using a second connector at a second position of the memory module; where the second position is different from the first position.

In one embodiment of the memory system, at least one slot is electrically connected to a chip set and at least one memory module is disposed in the slot. In one embodiment, a transmission line such as a fiber optic cable electrically connects the second connector of the memory module and the chip set.

As will be appreciated, more than one slot and therefore, more than one memory module may exist in the memory system. In one embodiment, in this situation, the transmission lines connecting the chip set to the respective memory modules have a same length.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
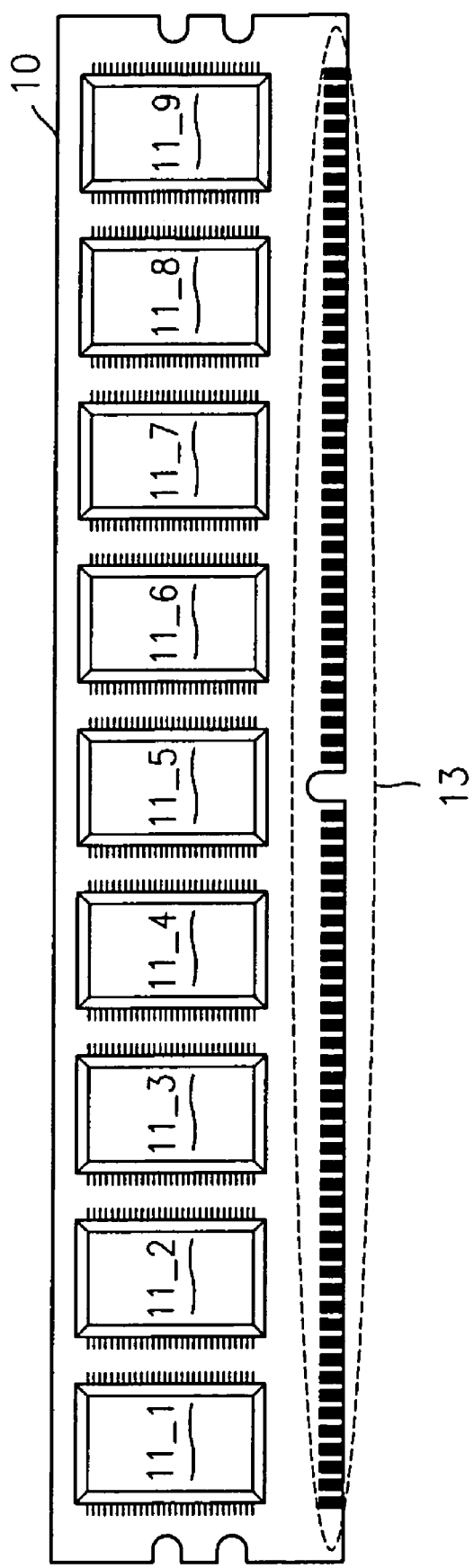
FIG. 1 is a view of a prior art memory module.
Figure 2:
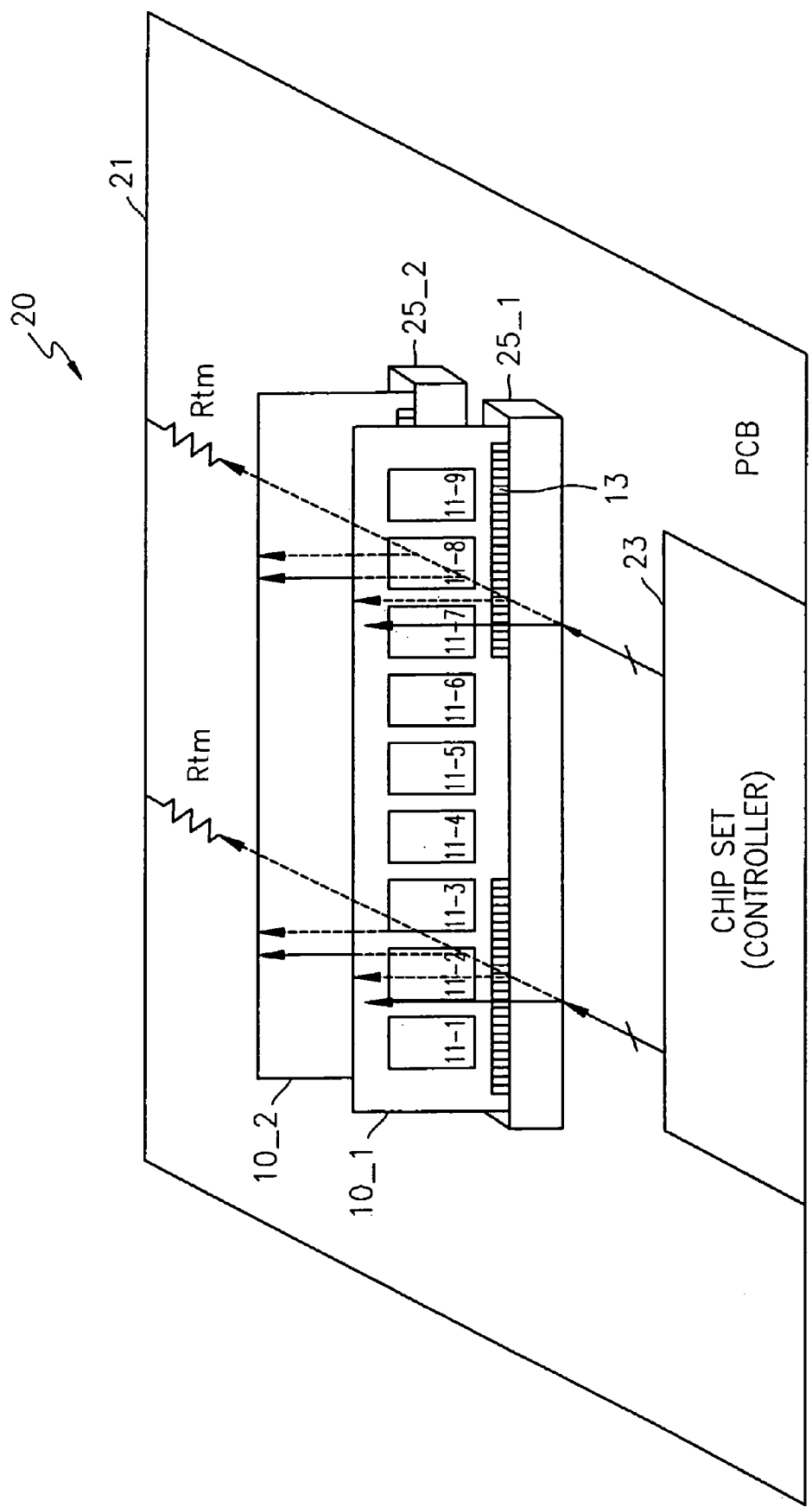
FIG. 2 is a view of a prior art memory system including the memory module of FIG. 1.

Hereinafter, the present invention will be described in detail by explaining example embodiments of the present invention with reference to the attached drawings. Like reference numerals in the drawings denote like elements.

Figure 3:
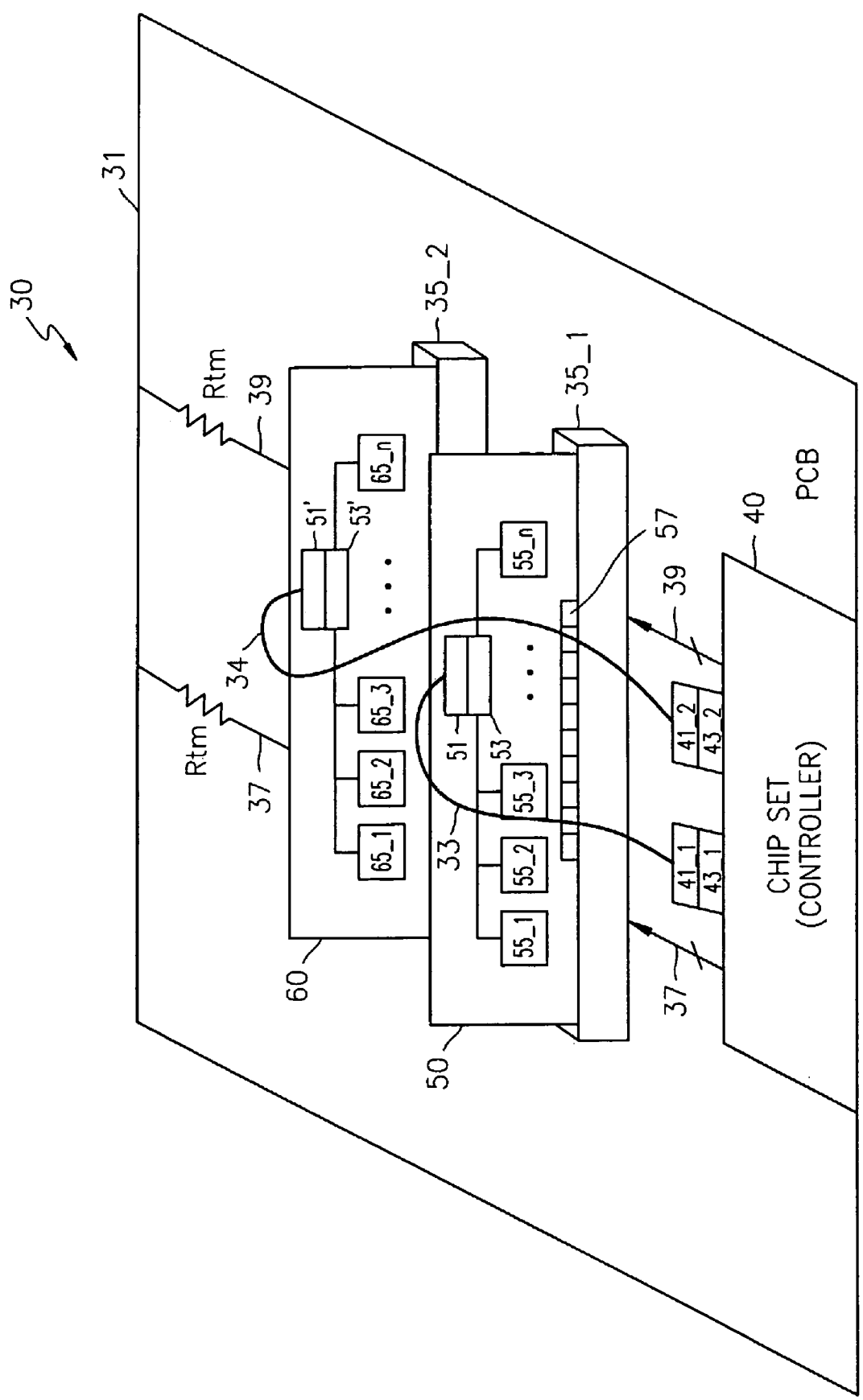
FIG. 3 is a view of a memory system having a memory module according to an embodiment of the present invention.

FIG. 3 is a view of a memory system having a memory module according to an embodiment of the present invention. Referring to FIG. 3, a memory system 30 may include a motherboard 31, a chip set 40 (or a controller), slots 35_1 and 35_2, memory modules 50 and 60, and transmission lines 33 and 34. Buses 37 and 39 connect the chip set 40 with the slots 35_1 and 35_2. A terminal resistor Rtm may terminate each of the buses 37 and 39 on a PCB of the motherboard 31.

For convenience, in FIG. 3, only the slots 35_1 and 35_2, the memory modules 50 and 60, and the transmission lines 33 and 34 are shown. However, a memory system according to the present invention is not limited to these elements or number of elements.

The chip set 40 may be mounted on the PCB of the motherboard 31 and control the operation of the memory system 30. The chip set 40 may include connectors 41_1 and 41_2 and converters 43_1 and 43_2.

The converter 43_1 receives parallel data generated by the chip set 40, converts the parallel data to serial data, and outputs the serial data to the transmission line 33 via the connector 41_1. The converter 43_1 receives serial data input via the transmission line 33 and the connector 41_1, converts the serial data to parallel data, and outputs the parallel data to the chip set 40.

The converter 43_2 receives parallel data generated by the chip set 40, converts the parallel data to serial data, and outputs the serial data to the transmission line 34 via the connector 41_2. The converter 43_2 receives serial data input via the transmission line 34 and the connector 41_2, converts the serial data to parallel data, and outputs the parallel data to the chip set 40.

The memory module 50 may include a plurality of memory devices 55_i (where i is 1 through n, n being greater than 1), a first connector 57 having a plurality of connection terminals, a second connector 51, and a converter 53. The memory module 60 may include a plurality of memory modules 65_i (where i is 1 through n, n being greater than 1), a first connector 57' having a plurality of connection terminals, a second connector 51', and a converter 53'.

The first connector 57 may include a plurality of connection terminals (also called module taps) installed at a first position on the memory module 50. The first position refers to any position on the memory module 50 as well as the edge of the memory module 50 as shown.

The first connector 57 is connected by a bus (not shown) to the plurality of memory devices 55_i. The first connector 57 carries low-speed signals such as a power voltage, a ground voltage, a clock signal or the low-speed data received from the chip set 40 to the plurality of memory devices 55_i. The second connector 51, to which the transmission line 33 for transmitting high-speed signals such as high-speed data is connected, may be installed in a second position different from (e.g., next to or opposite to) that of the first connector 57. Here, the low-speed signals and the high-speed signals may be classified according to established standards. Notably, the low-speed signals are a lower speed form of signaling (e.g., lower transmission rate) than the high speed signals.

The converter 53 receives serial data input via the second connector 51, converts the serial data to parallel data, and outputs the parallel data to the plurality of semiconductor memory devices 55_i. Alternatively, the converter 53 receives parallel data output from the plurality of semiconductor memory devices 55_i, converts the parallel data to serial data, and outputs the serial data to the second connector 51.

Accordingly, the converter 53 may include a receiver (not shown), and a first converter (not shown). The receiver receives the serial data input via the second connector 51. The first converter, which is connected to the receiver, receives the serial data, converts the serial data to parallel data, and outputs the parallel data to the plurality of semiconductor memory devices 55_i. Here, the first converter may include any type of data selector having a demultiplexer.

The converter 53 may also include a second converter (not shown), which receives parallel data output from the plurality of semiconductor memory devices 55_i, converts the parallel data to serial data, and outputs the serial data to the transmission line 33. The second converter may include any type of data selector having a demultiplexer.

The converter 53 may include a driver (not shown), which is connected to the second converter and transmits the serial data to the second connector 51. The converter 53, for example, may be a modem chip.

The memory module 60 may have the same structure as the memory module 50, with the memory devices 65_i, the connecter 57', the converter 53' and the connector 51' corresponding to the memory devices 55_i, the first connector 57, the converter 53 and the second connector 51 of the memory module 50.

The memory modules 50 and 60 are inserted into the slots 35_1 and 35_2, respectively. The transmission line 33 is connected between the connector 51 of the memory module 50 and the connector 41_1 of the chip set 40. The transmission line 34 is connected between the connector 51' of the memory module 60 and the connector 41_2 of the chip set 40. In one embodiment, the transmission lines 33 and 34 are optical fiber cables.

The power supplies (e.g., the power voltage and the ground voltage) and the clock signal may be supplied to the plurality of semiconductor memory devices 55_i (i is 1 through n) via the bus 37 on the PCB of the motherboard 31, the slot 35_1, the first connector 57, and a bus (not shown) on the PCB of the memory module 50.

Similarly, the power supplies (e.g., the power voltage and the ground voltage) and the clock signal may be supplied to the plurality of semiconductor memory devices 65_i (i is 1 through n) via the bus 39 on the PCB of the motherboard 31, the slot 35_2, the first connector 57', and a bus (not shown) on the PCB of the memory module 60.

Low-speed data (or signals) including a chip select signal, a read enable signal, and a write enable signal output from the chip set 40 may be input to the plurality of semiconductor memory devices 55_i (i is 1 through n) via the bus 37 on the PCB of the motherboard 31, the slot 35_1, the first connector 57, and the bus on the PCB of the memory module 50.

Similarly, low-speed data (or signal) including a chip select signal, a read enable signal, and a write enable signal output from the chip set 40 may be input to the plurality of semiconductor memory devices 65_i (i is 1 through n) via the bus 39 on the PCB of the motherboard 31, the slot 35_2, the first connector 57', and the bus on the PCB of the memory module 60.

However, a high-speed command signal, including high-speed data (or signals) and a data strobe signal output from the chip set 40, may be input to the connector 51 installed on the memory module 50 via the converter 43_1, the connector 41_1, and the transmission line 33.

A high-speed command signal including the high-speed data (or signals) and the data strobe signal output from the chip set 40 may be input to the connector 51' installed on the memory module 60 via the converter 43_2, the connector 41_2, and the transmission line 34.

Accordingly, the memory system 30 according to an embodiment of the present invention transmits high-speed data to the memory modules 50 and 60 via the transmission lines 33 and 34. The attenuation of data and crosstalk between the buses 37 and 39 on the PCB is thus improved.

If the lengths of the transmission lines 33 and 34 are the same, the time required for transmitting data between the memory module 50 and the chip set 40 may be equal to the time required for transmitting data between the memory module 60 and the chip set 40. Thus, data skews between the memory modules 50 and 60 and the chip set 40 decrease.

Accordingly, in the memory system 30 according to the present invention, buses transmitting high-speed data are not installed on a PCB. Instead, transmission lines or optical fibers are used to transmit high-speed data. Thus, data can be processed at a high speed.

In one embodiment, the memory module 50 is a single in line module (SIMM) or a dual in line module (DIMM).

While only two memory modules have been shown in the embodiment of FIG. 3, it will be understood that additional modules could be added to the system.

Also, other types of memory modules may be used in the present invention. For example, FIGS. 4 through 7 show other embodiments of memory modules that may be used (e.g., inserted into slot 35_1 or 35_2), but are by no means an exhaustive showing of examples.

Figure 4:
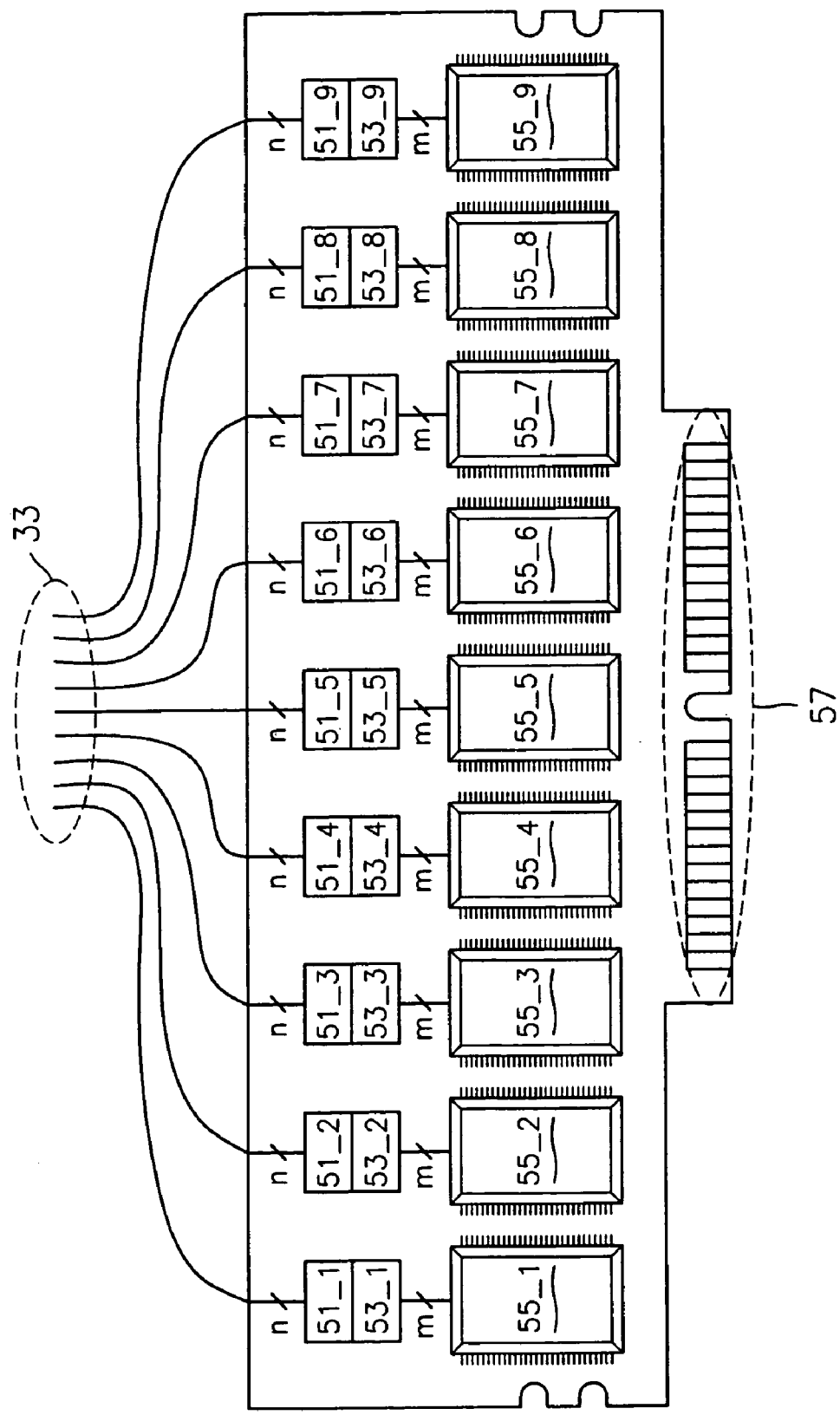
FIG. 4 is a view of a memory module according to an embodiment of the present invention.

FIG. 4 is a view of a memory module according to another embodiment of the present invention. Referring to FIG. 4, the memory module includes the first connector 57, the plurality of semiconductor memory devices 55_i (where i is 1 through 9), a plurality of converters 53_i (where i is 1 through 9), and a plurality of second connectors 51_i (where i is 1 through 9). As shown, each connector 51_i and each converter 53_i is associated with one of the memory devices 55_i.

The first connector 57 has a plurality of connection terminals, which are arranged along the edge of the memory module. If the memory module is inserted into, for example, the slot 35_1 shown in FIG. 3, the power voltage, the ground voltage, the clock signal and/or other low speed data output from the chip set 40 may be input to the plurality of semiconductor memory devices 55_i via the bus 37 on the PCB of the motherboard 31, the first connector 57 and the bus (not shown) of the memory module.

In this embodiment, the second connectors 51_i are installed in a position opposite to the first connector 57. However, the second connectors 51_i may be installed in any position on the memory module.

The converters 53_i are respectively connected between the second connectors 51_i and the semiconductor memory devices 55_i. Each of the converters 53_i receives n (where n is a natural number) bit serial data input via a respective one of the second connectors 51_i, converts the n bit serial data to m bit parallel data, and outputs the m bit parallel data to its respective semiconductor memory devices 55_i.

Each of the converters 53_i receives the m bit parallel data output from a respective one of the semiconductor memory devices 55_i, converts the m bit parallel data to n bit serial data, and outputs the n bit serial data to a respective one of the second connectors 51_i. The transmission line 33 transmits the n bit serial data to the connector 41_1 shown in FIG. 3. The transmission line 33 is a bundle of a plurality of optical fibers. The memory module shown in FIG. 4 is suitable, for example, for a parallel bus configuration.

Instead of slot 35_1, the memory module of FIG. 4 may be inserted into a different slot such as slot 35_2 and connected to the respective transmission line, for example, transmission line 34.

Figure 5:
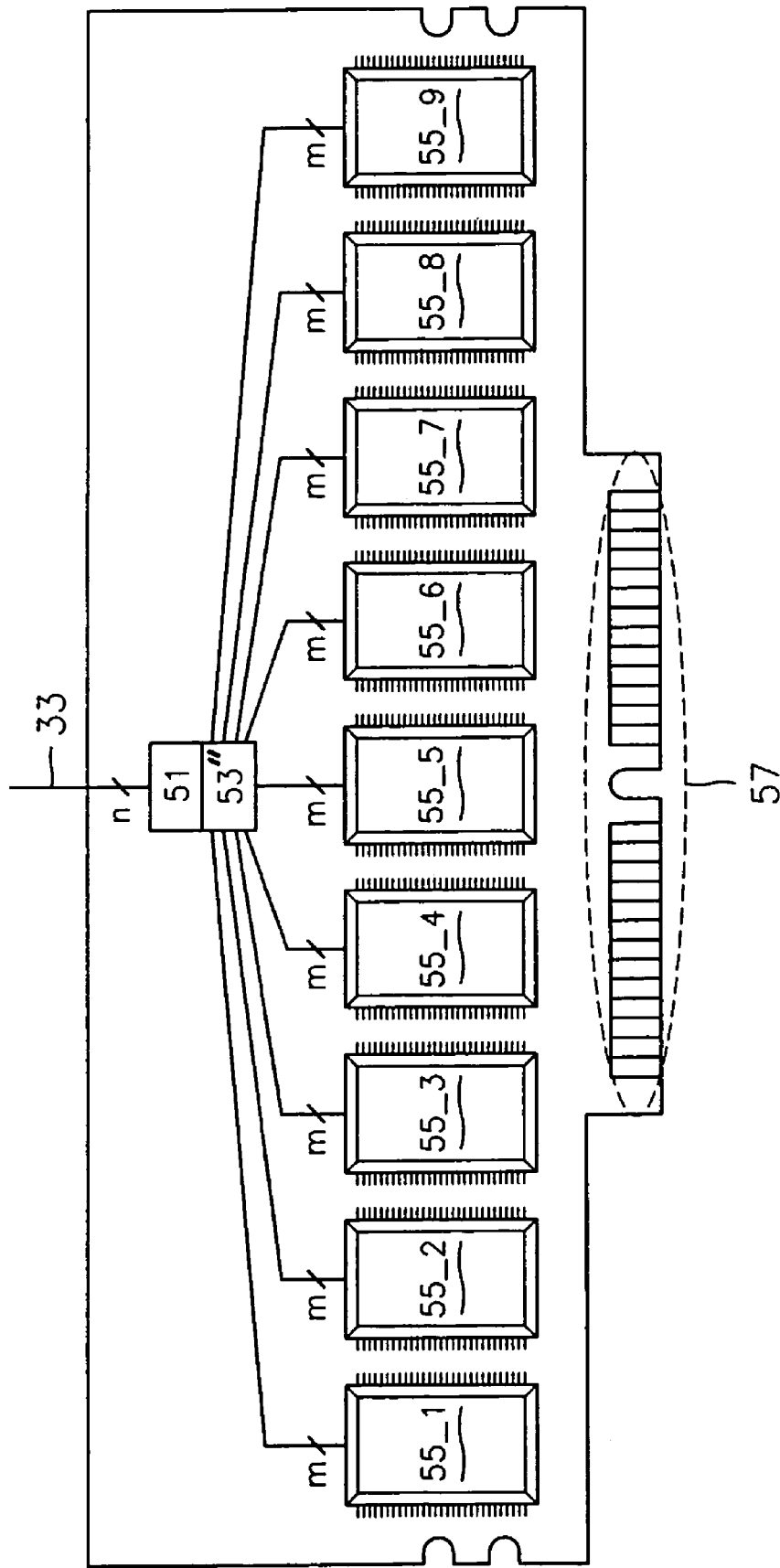
FIG. 5 is a view of a memory module according to another embodiment of the present invention.

FIG. 5 is a view of a memory module according to another embodiment of the present invention. The memory module shown in FIG. 5 includes the first connector 57, the plurality of semiconductor memory devices 55_i (i is 1 through 9), a converter 53", and the second connector 51. The second connector 51 is installed in a position different from that of the first connector 57, and serves to input and output data. Namely, the structure and function of the first connector 57 shown in FIG. 5 is the same as the first connector 57 shown in FIG. 3 or FIG. 4.

The converter 53" receives n (where n is a natural number) bit serial data input via the second connector 51, converts the n bit serial data to i (e.g., i=1-9 in this embodiment) groups of m bit parallel data, and outputs each m bit parallel data group to a respective one of the semiconductor memory devices 55_i.

Also, the converter 53" receives the m bit parallel data output from each of the semiconductor memory devices 55_i, converts the i groups of m bit parallel data to n bit serial data, and outputs the n bit serial data to the second connector 51. The transmission line 33 carries the n bit serial data to the connector 41_1 shown in FIG. 3. The memory module shown in FIG. 5 may be suitable, for example, for a serial bus configuration.

Figure 6:
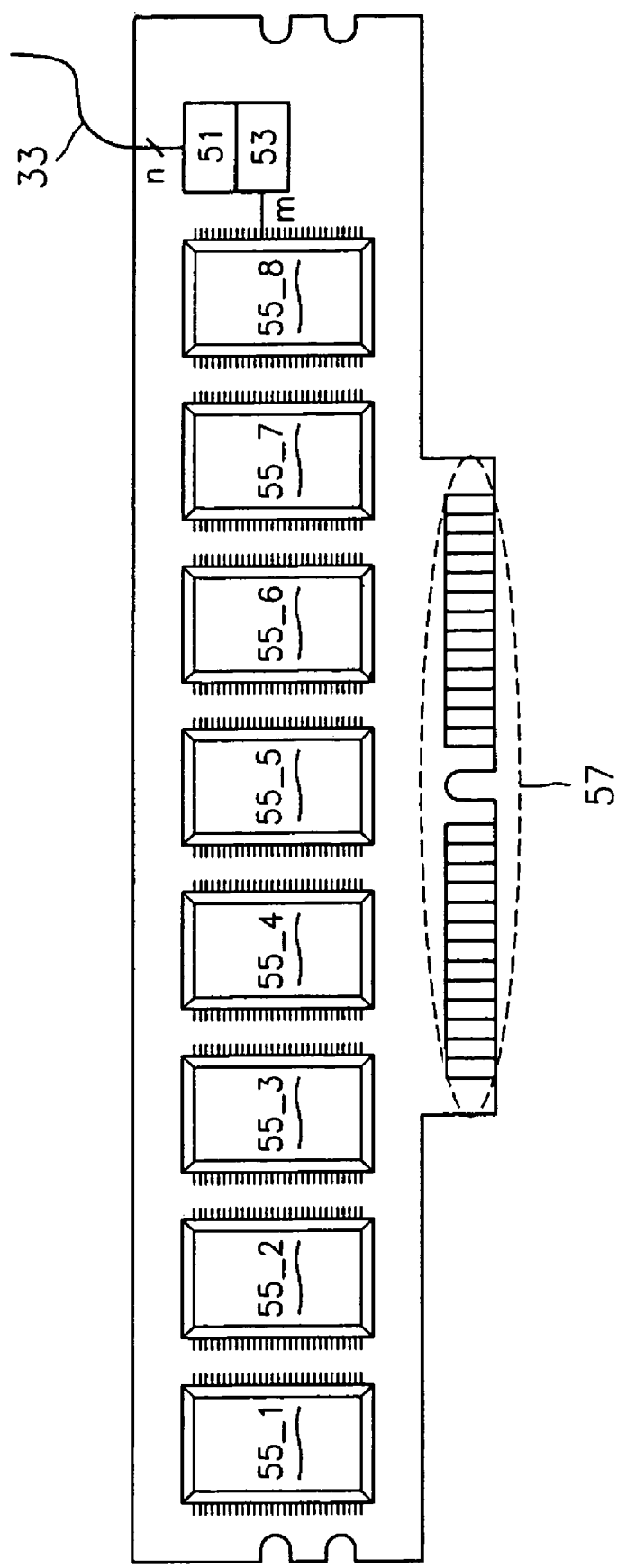
FIG. 6 is a view of a memory module according to still another embodiment of the present invention.

FIG. 6 is a view of a memory module according to still another embodiment of the present invention. The memory module shown in FIG. 6 includes the first connector 57, the plurality of semiconductor memory devices 55_i (i is 1 through 8), the converter 53, and the second connector 51. In this embodiment, the converter 53 and the second connector 51 are installed laterally outside the area of the memory module including the semiconductor memory device 55_i.

The structure and function of the first connector 57 shown in FIG. 6 are the same as those of the first connector 57 shown in FIG. 3 or FIG. 4. While for ease of illustration only the memory device 55_8 is shown connected to the converter 53, each of the semiconductor memory devices 55_i may transmit high-speed data to the transmission line 33 via the converter 53 and the second connector 51 and receive data via second connector 51, the converter 53, and the transmission line 33.

Figure 7:
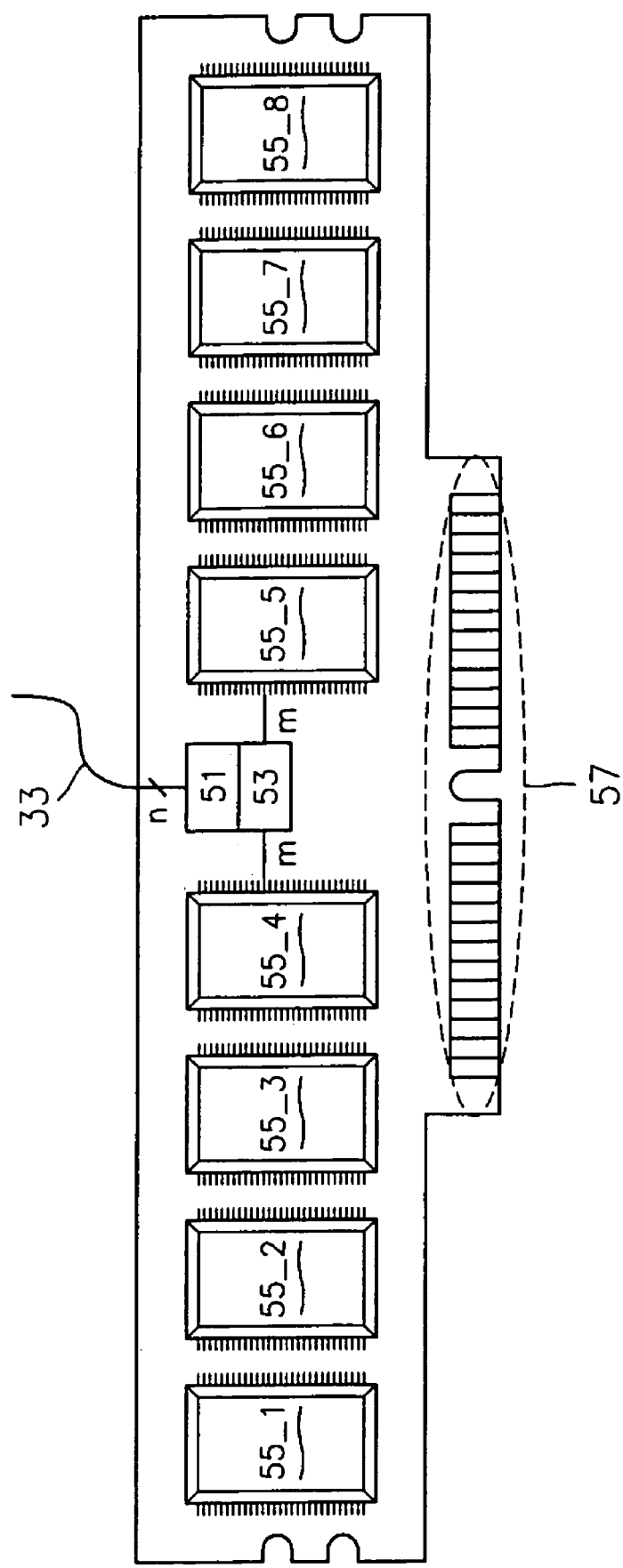
FIG. 7 is a view of a memory module according to still yet another embodiment of the present invention.

FIG. 7 is a view of a memory module according to yet another embodiment of the present invention. The memory module shown in FIG. 7 includes the first connector 57, the plurality of semiconductor memory devices 55_i (i is 1 through 8), the converter 53, and a second connector 51. In this embodiment, the semiconductor memory devices 55_i (i is 1 through 8) are installed symmetrically on either side of the converter 53 and the second connector 51. Namely, as shown, the memory devices 55_1 to 55_4 are disposed on one side of the converter 53 and the second converter 51, and the memory devices 55_5 to 55_8 are disposed on the other side. While for ease of illustration only the memory devices 55_4 and 55_5 are shown connected to the converter 53, each of the memory devices 55_i may transmit high-speed data to the transmission line 33 via the converter 53 and the second connector 51 and receive data via the second connector 51, the converter 53, and the transmission line 33. The memory module shown in FIG. 7 may be suitable, for example, for a serial bus configuration.

As described above, in a memory module according to the present invention, the number of pins to be connected to a motherboard may be reduced. Thus, the degree of freedom with respect to the size of the memory module increases. Therefore, it is possible to design various types of memory modules.

In a memory module and memory system, according to embodiments of the present invention, a path for transmitting high-speed data and a path for transmitting low-speed data are separate, and interference and crosstalk among transmission lines for transmitting data may be reduced. Also, loss or attenuation of data being transmitted may be reduced. Thus, data can be transmitted at a high speed.

Moreover, in a case where the lengths of transmission lines or optical fibers for connecting a chip set to the memory module are identical, skew of data between the chip set and the memory module can be reduced.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A memory module, comprising:
   a plurality of memory devices;
   a first connector configured to carry low-speed signals for the memory devices;
   a second connector configured to carry high-speed signals for the memory devices,
   wherein the second connector is configured to receive an optical fiber line for carrying the high-speed signals, and the second connector is disposed substantially in a center of the memory module in a longer axis direction such that the memory devices are arranged substantially symmetrically with respect to the second connector in the longer axis direction; and
   a converter electrically connected between the second connector and the memory devices, wherein the converter is configured to receive n-bit serial data from the optical fiber line through the second connector, to convert the n-bit serial data into groups of m-bit parallel data, and to output each m-bit parallel data to respective memory devices.

2. The memory module of claim 1, wherein n and m are natural numbers.

3. The memory module of claim 1, wherein the high-speed signals and the low-speed signals are received from a controller.

4. The memory module of claim 1, wherein the second connector is disposed between two neighboring memory devices.

5. The memory module of claim 1, wherein the low-speed signals comprise at least one of a power supply and a ground voltage.

6. The memory module of claim 1, wherein the high-speed signals comprise high-speed data.

7. The memory module of claim 1, wherein the first connector is disposed along a protrusion protruding from a side of the memory module.

8. A system, comprising:
   a controller including a first connector and a second connector;
   a first slot and a second slot electrically connected to the controller, wherein the first slot is configured to receive a first memory module therein, and the second slot is configured to receive a second memory module therein; and
   a first fiber optical line and a second fiber optical line for carrying high-speed signals, wherein
   each memory module includes,
      a plurality of memory devices,
      a third connector configured to carry low-speed signals
      a fourth connector configured to carry high-speed signals,
      wherein the fourth connector is disposed substantially in a center of the memory module in a longer axis direction such that the memory devices are arranged substantially symmetrically with respect to the fourth connector in the longer axis direction; and
   a converter electrically connected between the fourth connector and the memory devices, wherein the converter is configured to receive n-bit serial data from the controller, to convert the n-bit serial data into groups of m-bit parallel data, and to output each m-bit parallel data to respective memory devices,
   wherein the first connector of the controller is connected to the fourth connector of the first memory module through the first optical fiber line, the second connector of the controller is connected to the fourth connector of the second memory module through the second optical fiber line, and the first optical fiber line and the second fiber optical line have substantially a same length.

9. The system of claim 8, wherein each third connector of the respective memory modules contacts electrical terminals disposed in the respective first and second slots.

10. The system of claim 8, wherein n and m are natural numbers.

11. The system of claim 8, wherein each fourth connector of respective memory modules is disposed between two neighboring memory devices.

12. The memory module of claim 8, wherein the low-speed signals include at least one of a power supply voltage and a ground voltage.

13. The system of claim 8, wherein the high-speed signals include high-speed data.

14. The system of claim 8, wherein each third connector of the respective memory modules is disposed along a protrusion protruding from a side of the respective memory modules.

* * * * *